United States Patent [19]

Hagino

[11] Patent Number: 5,086,324

[45] Date of Patent: Feb. 4, 1992

[54] INSULATED GATE BIPOLAR TRANSISTOR

[75] Inventor: Hiroyasu Hagino, Itami, Japan

[73] Assignee: Mitsubishi Denki Kabushiki Kaisha, Tokyo, Japan

[21] Appl. No.: 341,630

[22] Filed: Apr. 21, 1989

[30] Foreign Application Priority Data

Jul. 11, 1988 [JP] Japan .................. 63-280608

[51] Int. Cl.⁵ .............. H01L 29/68; H01L 29/78; H01L 29/06
[52] U.S. Cl. .................. 357/23.5; 357/23.9; 357/23.14
[58] Field of Search ............ 357/55, 23.4, 23.14, 357/23.15, 35, 43, 71, 23.7, 15, 81, 23.9

[56] References Cited

U.S. PATENT DOCUMENTS

| | | | |
|---|---|---|---|
| 4,799,095 | 1/1989 | Baliga | 357/23.4 |
| 4,801,986 | 1/1989 | Chang et al. | 357/23.4 |
| 4,827,321 | 5/1989 | Baliga | 357/55 |
| 4,866,313 | 9/1989 | Tabata et al. | 357/23.4 |
| 4,952,992 | 8/1990 | Blanchard | 357/15 |

FOREIGN PATENT DOCUMENTS

57-103355 6/1982 Japan .
61-15370 1/1983 Japan .
61-82477 4/1986 Japan .
62-165965 7/1987 Japan .

Primary Examiner—Andrew J. James
Assistant Examiner—Carl Whitehead, Jr.
Attorney, Agent, or Firm—Oblon, Spivak, McClelland, Maier & Neustadt

[57] ABSTRACT

The present invention direct to a semiconductor device and a method of manufacturing the same. According to the semiconductor device of the present invention, a first region is partially formed on a major surface of a semiconductor substrate so as to have the opposite conductivity to the first region, and an electrode is formed on the major surface. A barrier layer may be formed between the region adjacent to the first region of the semiconductor substrate and the electrode in order to reduce a current flowing in a parasitic diode. Or, an area of a connecting part between the first region and the electrode may be set to be larger than that of a connecting part between the region adjacent to the first region of the semiconductor substrate and the electrode in order to reduce a current flowing in a parasitic diode. Or, both of technique mentioned above may be combined to reduce a current flowing in a parasitic diode. Thus, it is possible to provide a semiconductor device which can be fit for high-frequency use.

10 Claims, 11 Drawing Sheets

INSULATED GATE BIPOLAR TRANSISTOR

BACKGROUND OF THE INVENTION

1. Field of the Invention

The present invention relates to a semiconductor device and a method of manufacturing the same, and more particularly, it relates to an insulated gate bipolar transistor (hereinafter referred to as IGBT) profitably used for an inverter and a method of manufacturing the same.

2. Description of the Background Art

Figure 22:
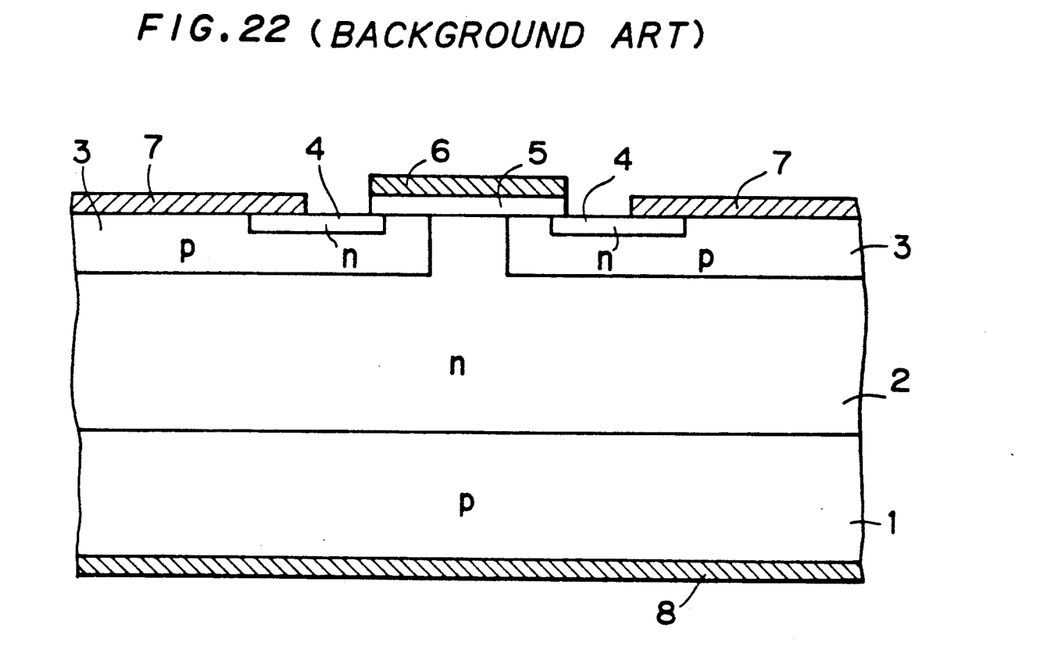
FIG. 22 is a sectional view showing a cell structure of a conventional IGBT.

In general, an IGBT device is formed by a number of parallel-connected IGBT elements (hereinafter referred to as IGBT cells). FIG. 22 is a sectional view showing a structure of a conventional n-channel IGBT cell.

Referring to FIG. 22, an n-type epitaxial layer 2 is provided on a p-type collector layer 1 consisting of a p-type semiconductor substrate. A p-type base region 3 is partially formed in the surface of the epitaxial layer 2 by selectively diffusing a p-type impurity, and n-type emitter region 4 is formed partially in the surface of the base region 3 by selectively diffusing an n-type impurity. A gate insulation film 5 is formed on the surface of the base region 3 between the surfaces of the epitaxial layer 2 and the emitter region 4. This gate insulation film 5 is provided so as to extend over the IGBT cells adjacent to each other. A gate electrode 6 of, for example, polysilicon, is formed on the gate insulation film 5, and an emitter electrode 7 of metal such as aluminum is formed to be electrically connected to both of the base region 3 and the emitter region 4. The gate electrode 6 and the emitter electrode 7 are commonly electrically connected to each cell forming the IGBT device. A collector electrode 8 of metal is formed on the back surface of the collector layer 1 in common with each of the IGBT cells.

The IGBT device is a voltage controlled transistor having an insulation gate (MOS gate) as well as MOS FET, and therefore it has the advantage of symplifying the structure of a drive circuit. The IGBT device comprises the collector layer 1 consisting of a p-type region for injecting a hole into the epitaxial layer 2, and hence a conductivity modulation effect arises in the epitaxial layer 2 by an injection of a hole from the collector layer 1, so that lower on-state resistance can be implemented in contrast to a MOS FET having high breakdown voltage. Because of above both advantages, the IGBT device is noted as the most desirable element for an inverter.

Figure 23:
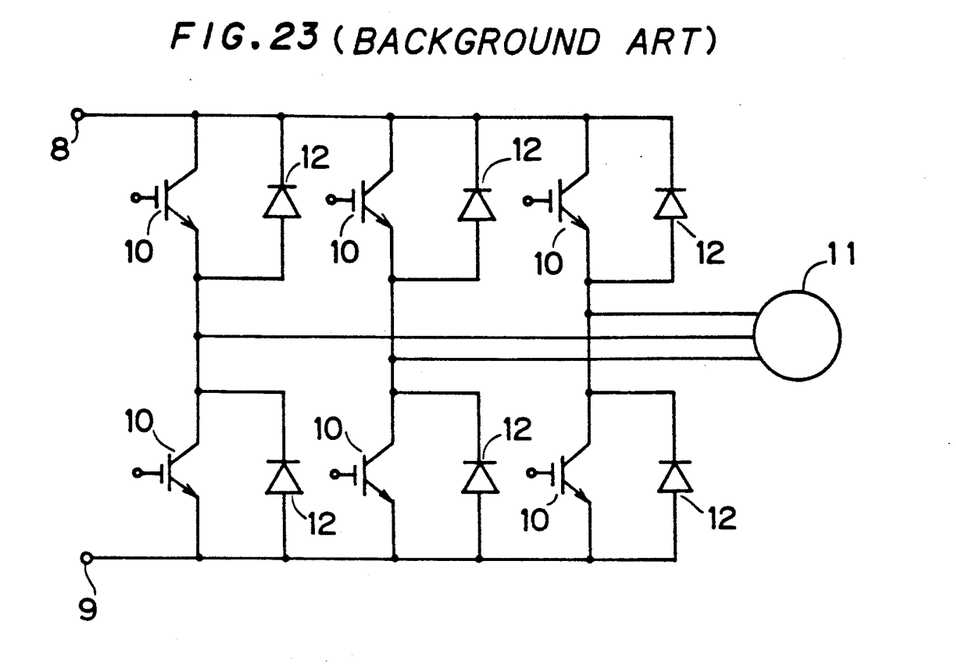
FIG. 23 is a circuit diagram showing an example of a three-phase inverter circuit having IGBT devices.

FIG. 23 shows an example of a three-phase inverter circuit having IGBT devices. As shown in FIG. 23, six IGBT devices 10 and a motor 11 as a load are connected between a positive feed terminal 8 and a negative feed terminal 9 to form a three-phase inverter bridge, and fly-wheel diodes 12 are connected in parallel to the IGBT devices 10 for improving the switching characteristic of the IGBT devices 10, respectively. The fly-wheel diodes 12 are generally fixed to the outside of a chip in which the IGBT devices 10 are formed.

In a case where each IGBT device 10 of the inverter circuit shown by FIG. 23 is constituted by the IGBT device as shown in FIG. 22, a carrier is accumulated in the epitaxial layer 2 when each IGBT cell is turned off. Since the life time of the carrier thus accumulated is long, the switching velocity of each IGBT device reduces.

Figure 24:
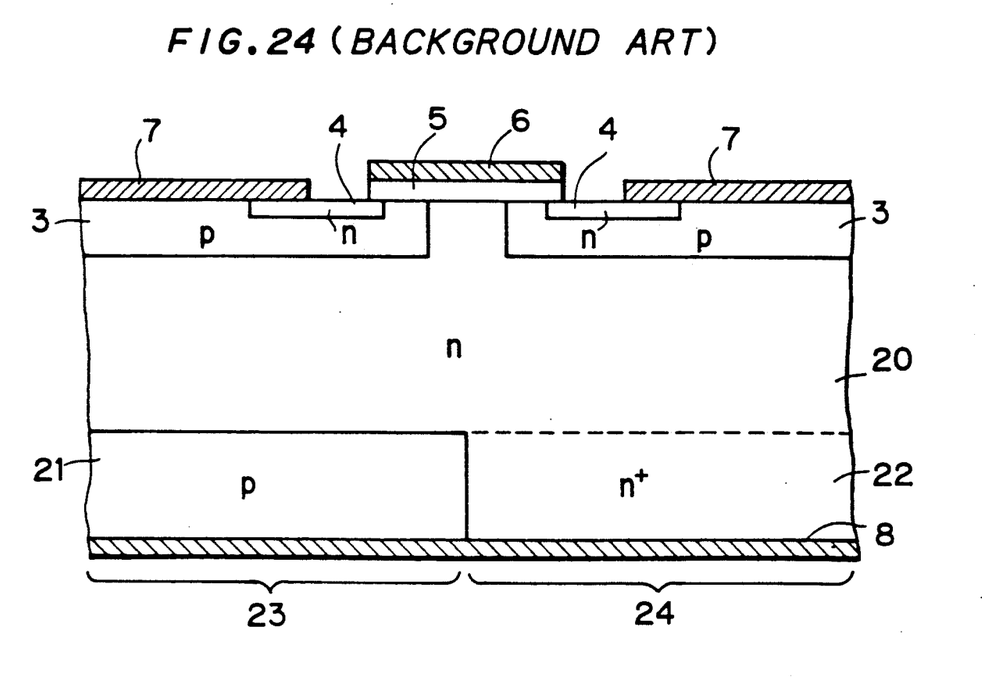
FIG. 24 is a sectional view showing a cell formed by combining an IGBT cell and a parasitic diode.

In order to accelerate the switching velocity of an IGBT device, such an IGBT device, for example, as shown in FIG. 24 may be proposed.

As shown in FIG. 24, in this IGBT device, a p-type collector region 21 is formed by selectively introducing a p-type impurity into a first major surface of an n-type semiconductor substrate 20 through a method such as diffusion and the like, and an n$^+$-type region 22 is formed by introducing an n-type impurity into a region except for the collector region 21 within the first major surface of the semiconductor substrate 20. The same reference numerals as in FIG. 22 designate like parts, and hence further explanation thereof will be omitted.

In this IGBT device, an IGBT cell 23 is formed, within the section corresponding to the collector region 21, by the collector region 21, the semiconductor substrate 20, the base region 3, the emitter region 4, the gate insulation film 5 and the gate electrode 6. According to the IGBT device, when each IGBT cell is turned off, the carrier (hole) accumulated in the semiconductor substrate 20 is extracted to the collector electrode 8 through the n$^+$-type region 22 having a low resistance value, and therefore the switching velocity of the IGBT cell can be accelerated without controlling the carrier life time of the IGBT cell. However, owing to existence of the n$^+$-type region 22 a parasitic diode 24 is unexpectedly formed, within the section corresponding to the n$^+$-type region 22, by the base region 3, the semiconductor substrate 20 and the n$^+$-type region 22. Since the parasitic diode 24 has a long recovery time, it causes the switching velocity of the IGBT device to reduce, and therefore it is impossible to use the IGBT device of FIG. 24 as a high speed device.

SUMMARY OF THE INVENTION

The present invention is directed to a semiconductor device and a method of manufacturing the same.

A first aspect of the invention provides a semiconductor device comprising; a first conductivity type semiconductor substrate; a first region of a second conductivity type partially formed on a first major surface of the semiconductor substrate; a second region of the first conductivity type partially formed on a second major surface of the semiconductor substrate; a third region of the second conductivity type partially formed on a surface of the second region; an insulation film formed on the surface of the second region and extending between the surfaces of the semiconductor substrate and the third region, the insulation film virtually locationally corresponding to the first region; a control electrode formed on the insulation film; a first electrode formed on the second major surface extending over the third region and the second region; a second electrode formed on the first major surface extending over the first region and a region adjacent to the first region of the semiconductor substrate; and a barrier layer formed at a region except for the first region within the first major surface of the semiconductor substrate for restricting movement of a carrier which moves toward the second electrode from the semiconductor substrate.

A second aspect of the invention provides a semiconductor device comprising: a first conductivity type semiconductor substrate; a first region of a second conductivity type partially formed on a first major surface of the semiconductor substrate; a second region of the first conductivity type partially formed on a second major surface of the semiconductor substrate; a third region of the second conductivity type partially formed on a surface of the second region; an insulation film formed on the surface of the second region and extending between the surfaces of the semiconductor substrate and the third region, the insulation film virtually locationally corresponding to the first region; a control electrode formed on the insulation film; a first electrode formed on the second major surface extending over the third region and the second region; and a second electrode formed on the first major surface extending over the first region and a region adjacent to the first region of the semiconductor substrate; a region except for the first region within the first major surface of the semiconductor substrate being connected with the second electrode by ohmic contact, an area of a connecting part therebetween being smaller than that of a connecting part between the first region and the second electrode.

A third aspect of the invention provides a semiconductor device comprising: a first conductivity type semiconductor substrate; a first region of a second conductivity type partially formed on a first major surface of the semiconductor substrate; a second region of the first conductivity type partially formed on a second major surface of the semiconductor substrate; a third region of the second conductivity type partially formed on a surface of the second region; an insulation film formed on the surface of the second region and extending between the surfaces of the semiconductor substrate and the third region, the insulation film virtually locationally corresponding to the first region; a control electrode formed on the insulation film; a first electrode formed on the second major surface extending over the third region and the second region; and a second electrode formed on the first major surface extending over the first region and a region adjacent to the first region of the semiconductor substrate; a region except for the first region within the first major surface of the semiconductor substrate being sectioned into a first area and a second area, the first area being connected with the second electrode by ohmic contact while a barrier layer being formed at a connecting part between the second area and the second electrode.

A fourth aspect of the invention provides a method of manufacturing a semiconductor device comprising: a first step of preparing a first conductivity type semiconductor substrate having a first major surface and a second major surface; a second step of introducing a second conductivity type impurity in a part of the first major surface of the semiconductor substrate to form a first region of the second conductivity type; a third step of forming a two-layer structure consisting of an insulation film and a control electrode on the second major surface of the semiconductor substrate so that the two-layer structure virtually locationally corresponds to the first region; a fourth step of introducing a first conductivity type impurity in a part of the second major surface of the semiconductor substrate by utilizing the two-layer structure as a mask to form a second region of the first conductivity type; a fifth step of forming a mask layer on a surface of the second region apart from the two-layer structure; a sixth step of introducing a second conductivity type impurity in a part of a surface of the second region by utilizing the two-layer structure and the mask layer as masks to form a third region of the second conductivity type; a seventh step of forming, after removing the mask layer, a first electrode on the second major surface extending over the third region and the second region so that the first electrode is connected by ohmic contact with the second region and the third region; an eighth step of forming a second electrode on the first major surface extending over the first region and a region adjacent to the first region of the semiconductor substrate so that a Schottky barrier layer is formed at a connecting part between the second electrode and the region adjacent to the first region of semiconductor substrate.

A fifth aspect of the invention provides a method of manufacturing a semiconductor device comprising: a first step of preparing a first conductivity type semiconductor substrate having a first major surface and a second major surface; a second step of introducing a second conductivity type impurity in a part of the first major surface of the semiconductor substrate to form a first region of the second conductivity type so that an area of a surface of the first region is set to be larger than that of a region except for the first region within the first major surface of the semiconductor substrate; a third step of forming a two-layer structure consisting of an insulation film and a control electrode on the second major surface of the semiconductor substrate so that the two-layer structure virtually locationally corresponds to the first region; a fourth step of introducing a first conductivity type impurity in a part of the second major surface of the semiconductor substrate by utilizing the two-layer structure as a mask to form a second region of the first conductivity type; a fifth step of forming a mask layer on a surface of the second region apart from the two-layer structure; a sixth step of introducing a second conductivity type impurity in a part of a surface of the second region by utilizing the two-layer structure and the mask layer as masks to form a third region of the second conductivity type; a seventh step of forming, after removing the mask layer, a first electrode on the second major surface extending over the third region and the second region so that the first electrode is connected by ohmic contact with the second region and the third region; an eighth step of introducing a first conductivity type impurity in the region except for the first region within the first major surface of the semiconductor substrate; a ninth step of forming a second electrode on the first major surface extending over the first region and the region adjacent to the first region of the semiconductor substrate so that the second electrode is connected by ohmic contact with the first region and the region adjacent to the first region of the semiconductor substrate.

A sixth aspect of the invention provides a method of manufacturing a semiconductor device comprising: a first step of preparing a first conductivity type semiconductor substrate having a first major surface and a second major surface; a second step of introducing a second conductivity type impurity in a part of the first major surface of the semiconductor substrate to form a first region of the second conductivity type; a third step of forming a two-layer structure consisting of an insulation film and a control electrode on the second major surface of the semiconductor substrate so that the two-layer structure virtually locationally corresponds to the first region; a fourth step of introducing a first conductivity type impurity in a part of the second major surface of the semiconductor substrate by utilizing the two-layer structure as a mask to form a second region of the first conductivity type; a fifth step of forming a mask layer on a surface of the second region apart from the two-layer structure; a sixth step of introducing a second conductivity type impurity in a part of a surface of the second region by utilizing the two-layer structure and the mask layer as masks to form a third region of the second conductivity type; a seventh step of forming, after removing the mask layer, a first electrode on the second major surface extending over the third region and the second region so that the first electrode is connected by ohmic contact with the second region and the third region; an eighth step of sectioning a region except for the first region within the first major surface of the semiconductor substrate into a first area and a second area, and introducing a first conductivity type impurity on the first area of the semiconductor substrate; a ninth step of forming a second electrode on the first major surface extending over the first region and the region adjacent to the first region of the semiconductor substrate so that the first area is connected by ohmic contact with the second electrode and a Schottky barrier layer is formed at a connecting part between the second area and the second electrode.

Accordingly, a principle object of the present invention is to provide a semiconductor device and a method of manufacturing the same which can be fit for high-frequency use.

According to the semiconductor device of the first aspect, since the barrier layer is formed at the region except for the first region within the first major surface of the semiconductor substrate in order to restrict movement of the carrier which moves toward the second electrode from the semiconductor substrate, it is possible to reduce a current flowing in a parasitic diode consisting of the second region and the semiconductor substrate, whereby an evil influence by delay of a recovery time of the parasitic diode can be restrained.

According to the semiconductor device of the second aspect, since the region except for the first region within the first major surface of the semiconductor substrate is connected by ohmic contact with the second electrode and the area of the connecting part therebetween is smaller than that of the connecting part between the first region and the second electrode, it is possible to reduce a current flowing in a parasitic diode consisting of the second region and the semiconductor substrate, whereby an evil influence by delay of a recovery time of the parasitic diode can be restrained.

According to the semiconductor device of the third aspect, the region except for the first region within the first major surface of the semiconductor substrate is sectioned into the first area and the second area, and the first area is connected by ohmic contact with the second electrode while the barrier layer is formed at the connecting part between the second area and the second electrode. Therefore, it is possible to reduce a current flowing in a parasitic diode consisting of the second region and the semiconductor substrate in order to restrain an evil influence by delay of a recovery time of the parasitic diode, and it is also possible to extract a carrier accumulated in the semiconductor substrate at the time of turn-off state of each IGBT cell to the second electrode through the first area in order to accelerate the switching velocity of the IGBT cell.

According to the method of manufactureing a semiconductor device about the fourth to the sixth aspects, it is possible to manufacture the semiconductor devices corresponding to the first to the third aspects which can be fit for high-frequency use.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
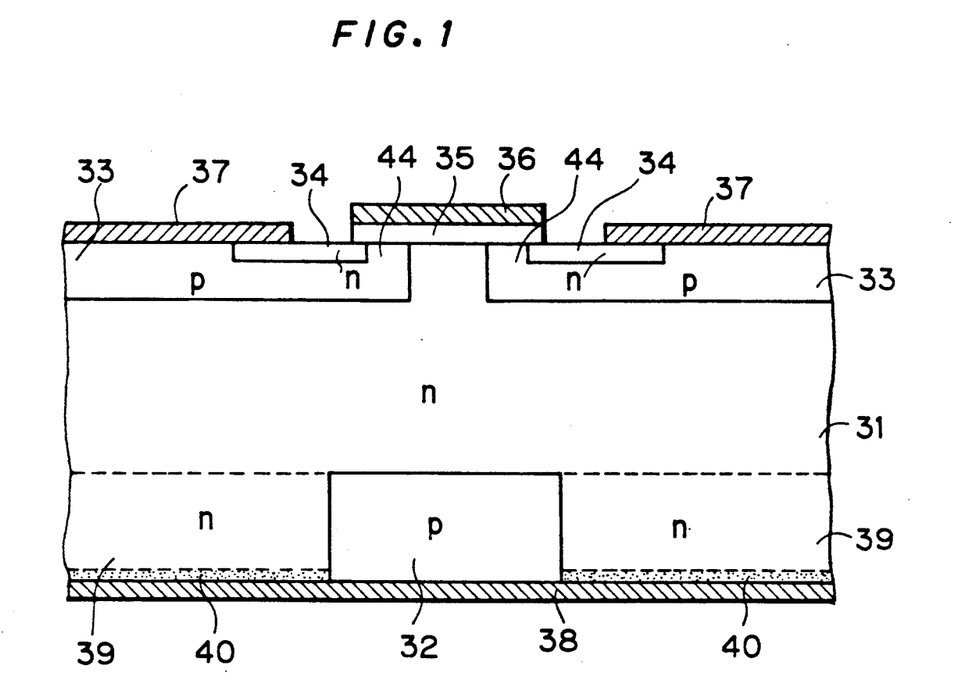
FIG. 1 is a sectional view showing a cell structure of an IGBT according to a first embodiment of the present invention.

FIG. 1 is a sectional view showing a cell structure of an IGBT according to a first embodiment of the present invention.

Referring to FIG. 1, a p-type collector region 32 is formed by selectively introducing a p-type impurity of high concentration on a first major surface of a semiconductor substrate 31 consisting of an n-type silicon substrate having a high resistance value. A p-type base region 33 is formed by selectively introducing a p-type impurity on a second major surface of the semiconductor substrate 31, and an n-type emitter region 34 is formed by selectively introducing an n-type impurity on a surface of the base region 33. A gate insulation film 35 is formed on the surfaces of the base region 33 between the surfaces of the semiconductor substrate 31 and the emitter region 34. This gate insulation film 35 is provided so as to extend over the IGBT cells adjacent to each other, and so as to virtually locationally correspond to the collector region 32. A gate electrode 36 is formed on the gate insulation film 35, and an emitter electrode 37 of metal such as almnum is formed to be electrically connected to both of the base region 33 and the emitter region 34. The gate electrode 36 and the emitter electrode 37 are commonly electrically connected to each cell forming the IGBT device. A collector electrode 38 of metal is formed on the first major surface extending over the collector region 32 and an n-type region 39 of the semiconductor substrate 31 adjacent to the collector region 32 so as to be connected in common with each of the IGBT cells. In this case, the collector region 32 and the collector electrode 38 are connected with each other by ohmic contact, while a Schottky barrier layer 40 is formed at a connection part between the n-type region 39 and the collector electrode 38.

Figure 2:
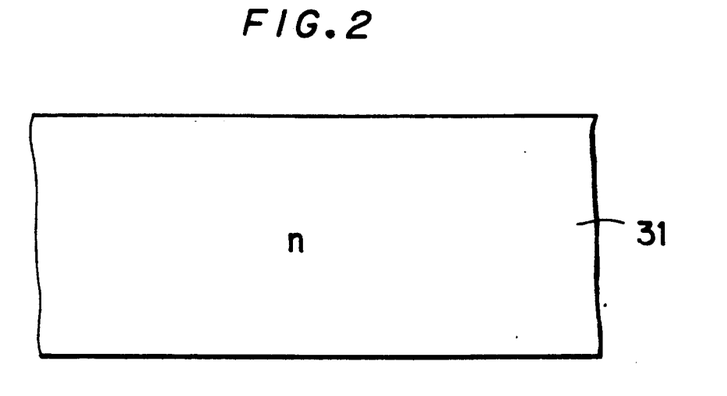
FIGS. 2 to 7 are sectional views showing a manufacturing process of the IGBT as shown in FIG. 1 respectively.

A method of manufacturing the above IGBT device will be described below. First, as shown in FIG. 2, a semiconductor substrate 31 consisting of an n-type silicon substrate having a high resistance value is prepared. Specific resistance of the semiconductor substrate 31 is, for example, about 50Ω·cm with the voltage of about 1000 V.

Figure 3:
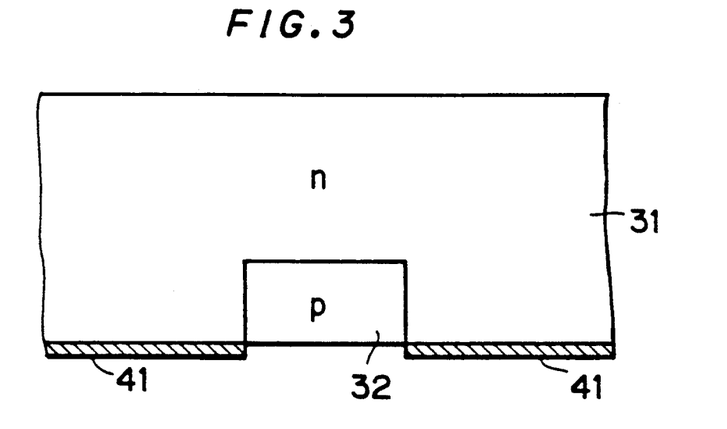

Next, a mask layer 41 such as a regist film, an oxide film and so on, is partially formed on a first major surface of the semiconductor substrate 31 as shown in FIG. 3, and a p-type collector region 32 is formed by selectively introducing a p-type impurity such as boron into the first major surface of the semiconductor substrate 31 with high concentration (surface concentration is more than $10^{19}/cm^3$) through a method such as ion implantation, diffusion and so on while utilizing the mask layer 41 as a mask.

Figure 4:
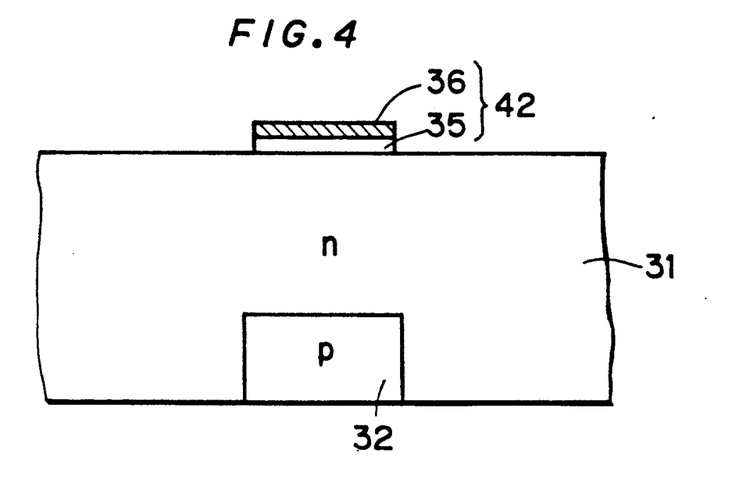

Then, a gate oxide film and a polysilicon layer is sequentially formed on a whole area of a second major surface of the semiconductor substrate 31, and thereafter the gate oxide film and the polysilicon layer thus formed are partially removed to form a two-layer structure 42 consisting of a gate oxide film 35 and a gate electrode 36 at the position virtually corresponding to the collector region 32 as shown in FIG. 4.

Figure 5:
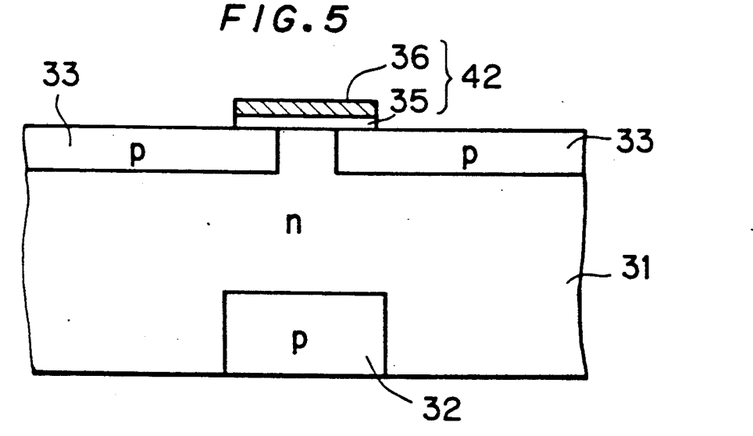

Next, a p-type base region 33 is formed by selectively introducing a p-type impurity into the second major surface of the semiconductor substrate 31 by utilizing the two-layer structure 42 as a mask as shown in FIG. 5. As a method of introducing the p-type impurity, a method having an excellent concentration controllability, such as ion implantation and so on is employed, because a surface of the base region 33 functions as a channel region. Generally, an injection quantity of the impurity is about $5 \times 10^{13}$ to $5 \times 10^{14}$ cm$^{-2}$.

Figure 6:
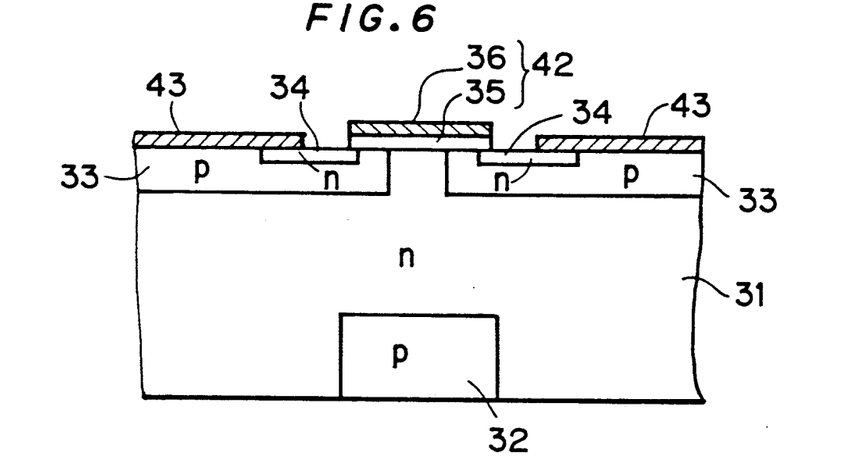

Thereafter, a mask layer 43 such as a regist film, an oxide film and so on, is partially formed on the surface of the base region 33, and then an n-type emitter region 34 is formed by selectively introducing an n-type impurity such as phosphorus, arsenic and so on, into the surface of the base region 33 with high concentration (surface concentration is more than $1 \times 10^{19}$ cm$^{-3}$) through a method such as ion implantation, diffusion and so on while utilizing the mask layer 43 and the two-layer structure 42 as masks as shown in FIG. 6. In this case, the surface of the base region 33 between the surface of the emitter region 34 and the surface of the semiconductor substrate 31 functions as a channel region 44 (see FIG. 1). The length of the channel region 44 is fixed over the whole area of each IGBT cell by employing a diffusion self-alignment structure.

Figure 7:
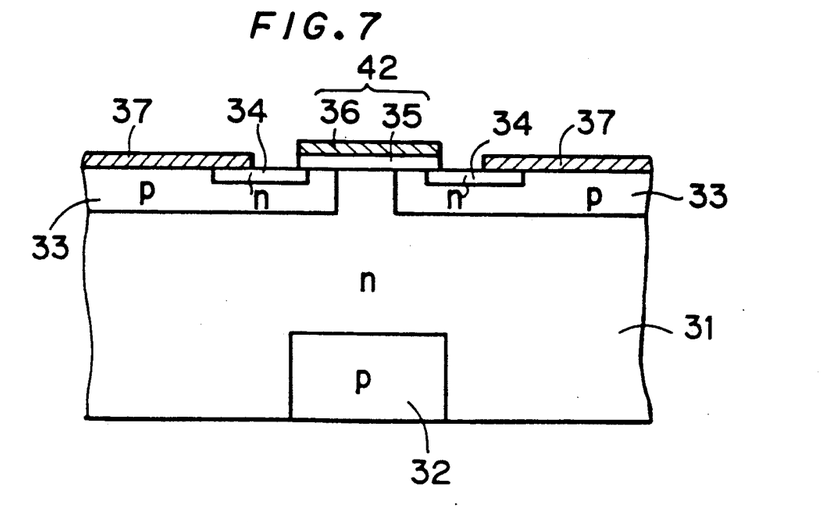

Next, the mask layer 43 is removed, and then emitter electrodes 37 of metal such as aluminum and so on, are formed on the second major surface extending over the emitter region 34 and the base region 33 as shown in FIG. 7. In this case, each emitter electrode 37 is connected by ohmic contact with the emitter region 34 and the base region 33.

Finally, a collector region 38 of metal is formed on the first major surface extending over the collector region 32 and an n-type region 39 of the semiconductor substrate 31 adjacent to the collector region 32 as shown in FIG. 1. In this case, the collector electrode 38 is connected by ohmic contact with the collector region 32 because the surface concentration of the p-type impurity in the collector region 32 is set to be larger than $10^{19}$ cm$^{-3}$. If the surface concentration of the collector region 32 becomes less than the above value, a Schottky barrier layer is formed between the collector region 32 and the collector electrode 38 to cause the saturation voltage of IGBT to increase. On the other hand, a Schottkey barrier layer 40 is formed between the n-type region 39 and the collector electrode 38. In order to form the Schottkey barrier layer 40, it is preferable that the surface concentration of the n-type impurity in the n-type region 39 is less than $10^{19}$ cm$^{-3}$.

In the semiconductor device thus formed, an IGBT cell is formed, within the section corresponding to the collector region 32, by the collector region 32, the semiconductor substrate 31, the base region 33, the emitter region 34, the gate insulation film 35 and the gate electrode 36, while a parasitic diode is formed, within the section corresponding to the n-type region 39, by the n-type region 39, the semiconductor substrate 31 and the base region 33.

Figure 8:
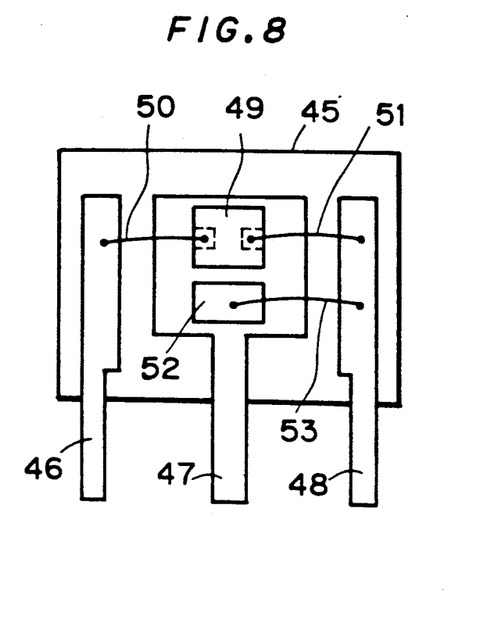
FIG. 8 is a plane view showing a IGBT module formed by connecting a fly-wheel diode chip and an IGBT chip of the above embodiment.

In a case where an inverter circuit is formed by the above semiconductor device, a high speed fly-wheel diode is electrically connected in parallel with the parasitic diode. To put it in the concrete, as shown in FIG. 8, for example, a gate terminal 46, a collector terminal 47 and an emitter terminal 48 are provided in a housing 45, and a collector electrode 38 (see FIG. 1) of an IGBT chip having the same structure as the semiconductor device as shown in FIG. 1 is connected with the collector terminal 47, while a gate electrode 36 and emitter electrode 37 of the IGBT chip are connected with the gate terminal 46 and the emitter terminal 48 through wires 50 and 51 respectively. A cathode electrode of a fly-wheel diode chip 52 is connected with the collector terminal 47, while an anode terminal of the fly-wheel diode chip 52 is connected with the emitter terminal 48 through a wire 53.

Figure 9:
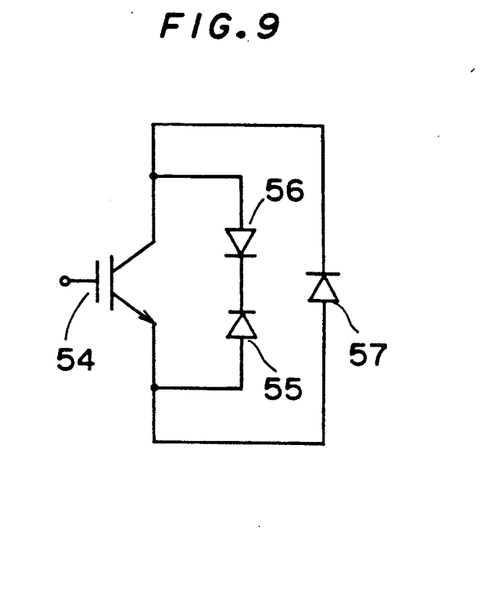
FIG. 9 is a circuit diagram showing an equivalent circuit of FIG. 8.

FIG. 9 is a circuit diagram showing an equivalent circuit of FIG. 8. In FIG. 9, a reference numeral 54 designates an IGBT formed by IGBT cells of the IGBT chip 49, a reference numeral 55 designates a parasitic diode of the IGBT chip 49, a reference numeral 56 designates a Schottkey barrier diode formed by a Schottkey barrier layer 40 of the IGBT chip 49, and a reference numeral 57 designates a fly-wheel diode formed by the fly-wheel diode chip 52.

The fly-wheel diode 57 is a high speed diode the recovery time of which is smaller than about 0.2 μs, and it is at least required such a relation as the current flowing in the fly-wheel diode 57 becomes larger than that flowing in the parasitic diode 56.

According to the circuit structure as shown in FIG. 9, the current flowing in the parasitic diode 55 is restrained by the Schottky barrier diode 56 to cause the current flowing in the fly-wheel diode 57 to relatively increase, whereby an evil influence by delay of a recovery time of the parasitic diode 55 can be restrained. Thus, it is possible to provide the semiconductor device which can be fit for high-frequency use.

Figure 10:
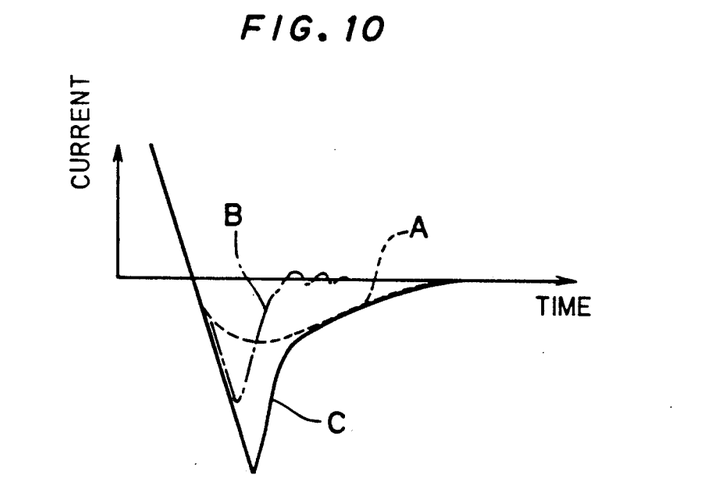
FIG. 10 is a view for explaining a recovery characteristics of the IGBT module.

FIG. 10 is a view for explaining a recovery characteristics of an IGBT module as shown in FIG. 8. That is, in FIG. 10, a dotted line A designates a recovery characteristics of an internal diode formed in the IGBT chip 49, the internal diode consisting of the parasitic diode 55 and the Schottky barrier diode 56. A dashed line B designates a recovery characteristics of the fly-wheel diode 57, while a solid line C designates a recovery characteristics of the IGBT module obtained by synthesizing the dotted line A and the dashed line B. As is evident from the solid line C as shown in FIG. 10, it can obtain a high speed recovery operation in the first half section of the recovery operation because the function of the fly-wheel diode 57 shown by the dashed line B appears remarkably, while it can cause the recovery operation to softly end in the latter half section of the recovery operation because the function of the internal diode shown by the dotted line A appears remarkably. Thus, it is possible to obtain an ideal recovery characteristics fitting for high-frequency use.

Figure 11:
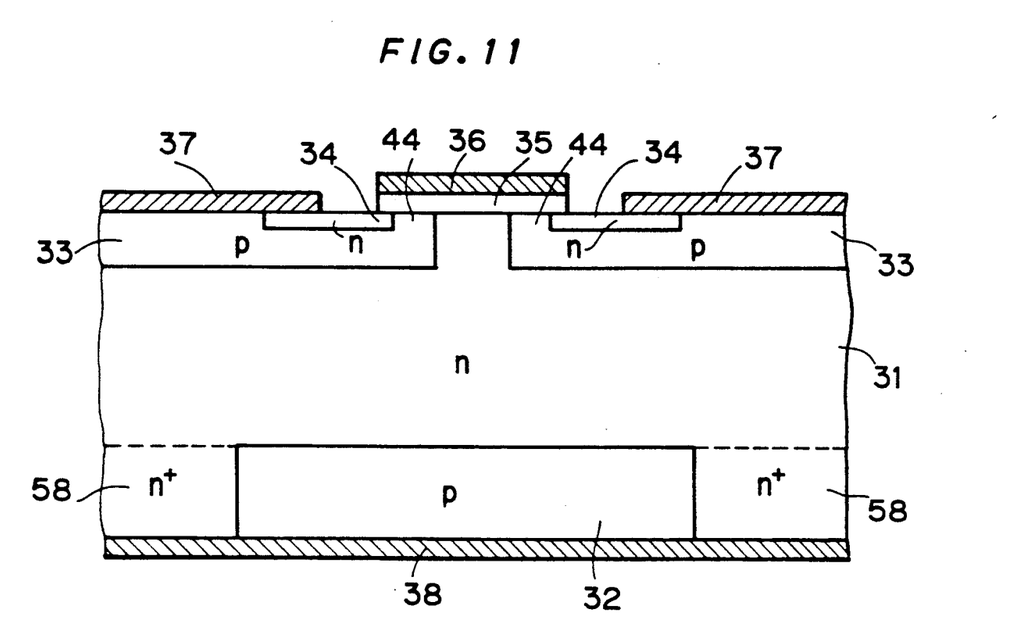
FIG. 11 is a sectional view showing a cell structure of an IGBT according to a second embodiment of the present invention.

FIG. 11 is a sectional view showing a cell structure of an IGBT according to a second embodiment of the present invention. In this embodiment, the width of a collector region 32 is set to such a large size as the area of the surface of the collector region 32 becomes larger than that of the surface of an n+-type region 58 exposed in the first major surface of the semiconductor substrate 31. The n+-type type region 58 is formed by introducing an n-type impurity with high concentration into the region except for the collector region 32 within the first major surface of the semiconductor substrate 31, and the n+-type region 38 is connected by ohmic contact with the collector region 38. In this case, it is required that forward drop voltage $V_F$ of a parasitic diode consisting of the base region 33, the semiconductor substrate 31 and the n+-type region 58 is large enough, for example, more than about 3 voltage with electric current density of 100 A/cm$^2$. The other construction is equal to that of the first embodiment as shown in FIG. 1, and hence further explanation thereof will be omitted by using the same reference numerals to like parts.

A manufacturing process of the above semiconductor device is different from that of the embodiment as shown in FIG. 1 only in the points of that the collector region 32 is formed to be larger in width and that a process for introducing an n-type impurity into the region 58 with high concentration is added so that the surface concentration of the region 58 becomes more than 10$^{19}$/cm$^3$.

Figure 12:
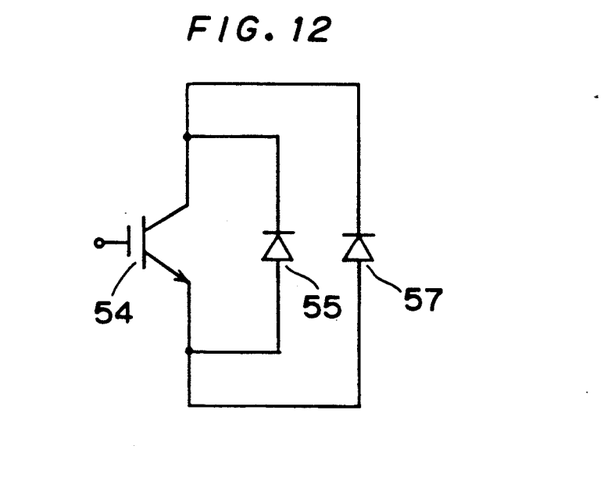
FIG. 12 is a circuit diagram showing an equivalent circuit of an IGBT module comprising an IGBT chip of the second embodiment.

FIG. 12 is a circuit diagram showing an equivalent circuit of an IGBT module formed by connecting a fly-wheel diode with an IGBT chip as shown in FIG. 11. In FIG. 12, a reference numeral 54 designates an IGBT formed by IGBT cells of the IGBT chip, a reference numeral 55 designates a parasitic diode of the IGBT chip, and a reference numeral 57 designates the fly-wheel diode.

According to this embodiment, since the area of the surface of the n+-type region 58 constituting a part of the parasitic diode 55 is set to be smaller than that of the surface of the collector region 32, the current flowing in the parasitic diode 55 is restrained to cause the current flowing in the fly-wheel diode 57 to relatively increase, whereby an evil influence caused by delay of a recovery time of the parasitic diode 55 can be restrained. Thus, it is possible to provide the semiconductor device which can be fit for high-frequency use.

Figure 13:
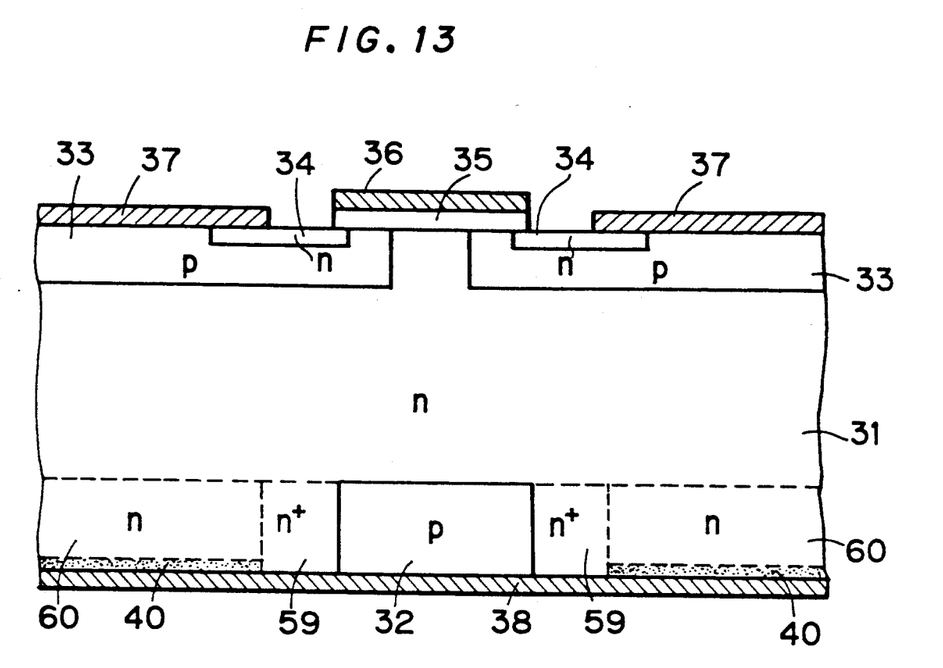
FIG. 13 is a sectional view of showing a cell structure of an IGBT according to a third embodiment of the present invention.

FIG. 13 is a sectional view showing a cell structure of an IGBT according to a third embodiment of the present invention. In this embodiment, a region except for a collector region 32 within the first major surface of the semiconductor substrate 31 is sectioned into a first area and a second area, and, in the first area, an n+-type region 59 is formed by selectively introducing an n-type impurity with high concentration into the first major surface in order to connect by ohmic contact with a collector electrode 38, while, in the second area, a Schottky barrier layer 40 is formed at a connecting part between the n-type region 60 and the collector electrode 38. Thus, a parasitic diode having a large forward drop voltage $V_F$ is formed by the base region 33, the semiconductor substrate 31 and the n+-type region 59. The other construction is equal to that of the first embodiment as shown in FIG. 1, and hence further explanation thereof will be omitted by using the same reference numerals to like parts.

A manufacture process of the above semiconductor device is different from that of the embodiment as shown in FIG. 1 only in the point that a process for introducing an n-type impurity into the region 59 with high concentration is added so that the surface concentration of the region 59 becomes more than 10$^{19}$/cm$^3$.

Figure 14:
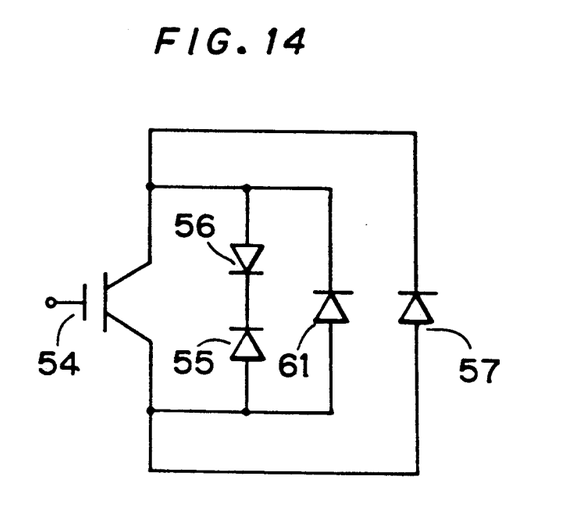
FIG. 14 is a circuit diagram showing an equivalent circuit of an IGBT module comprising an IGBT chip of the third embodiment.

FIG. 14 is a circuit diagram showing an equivalent circuit of an IGBT module formed by connecting a fly-wheel diode with an IGBT chip as shown in FIG. 13. In FIG. 14, a reference numeral 54 designates an IGBT formed by IGBT cells of the IGBT chip, a reference numeral 55 designates a parasitic diode consisting of the base region 33 and the semiconductor substrate 31, a reference numeral 56 designates a Schottky barrier diode formed by the Schottky barrier layer 40, a reference numeral 61 designates a parasitic diode consisting of the base region 33, the semiconductor substrate 31 and the n+-type region 59, and a reference numeral 57 designates a fly-wheel diode.

According to this embodiment, the current flowing in a subcircuit consisting of internal diodes 55, 56 and 61 of the IGBT chip is restrained to cause the current flowing in the fly-wheel diode 57 to relatively increase, whereby it is possible to obtain the same effect as the first and the second embodiments and it is possible to further obtain the following effect. That is, in the structure of the first embodiment as shown in FIG. 1, when a carrier accumulated in the semiconductor substrate 31 is extracted to the collector electrode 38 through the n+-type region 39 at the time of the turn-off of the IGBT, the movement of the carrier is restricted by the Schottky barrier layer 40, whereby the switching velocity of the IGBT decreases. Further, in the structure of the second embodiment as shown in FIG. 11, as an area of the surface of the collector region 32 increases, a number of the carrier accumulated in the semiconductor substrate 31 at the time of the turn-off of the IGBT increases, and therefore it is difficult to obtain a high speed device because a long time is required for extracting the carrier. On the contrary, in the structure of the third embodiment as shown in FIG. 13, since the carrier accumulated in the semiconductor substrate 31 at the time of the turn-off of the IGBT is extracted to the collector electrode 38 through the n+-type region 59, the carrier is extracted to the collector electrode 38 with a short time, whereby the switching velocity of the IGBT is accelerated. Further, the Schottky barrier layer 40, which is formed at a region except for a region being required for extracting the carrier, restrains the current flowing in the parasitic diode, and therefore an evil influence caused by delay of a recovery time of the parasitic diode can be restrained.

Figure 15:
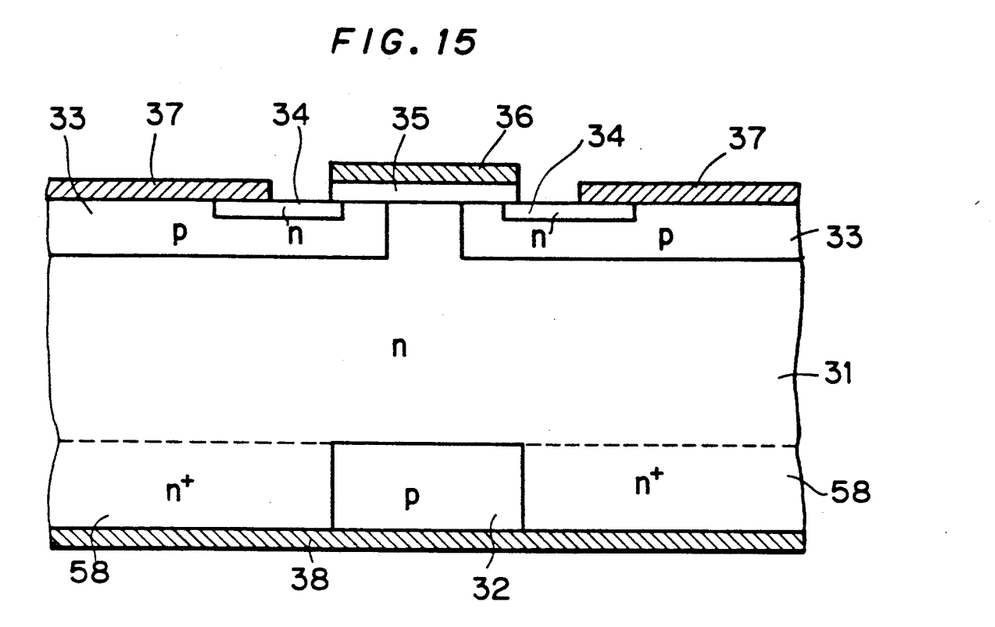
FIG. 15 is a sectional view of showing a cell structure of an IGBT used in a fourth embodiment of the present invention.
Figure 16:
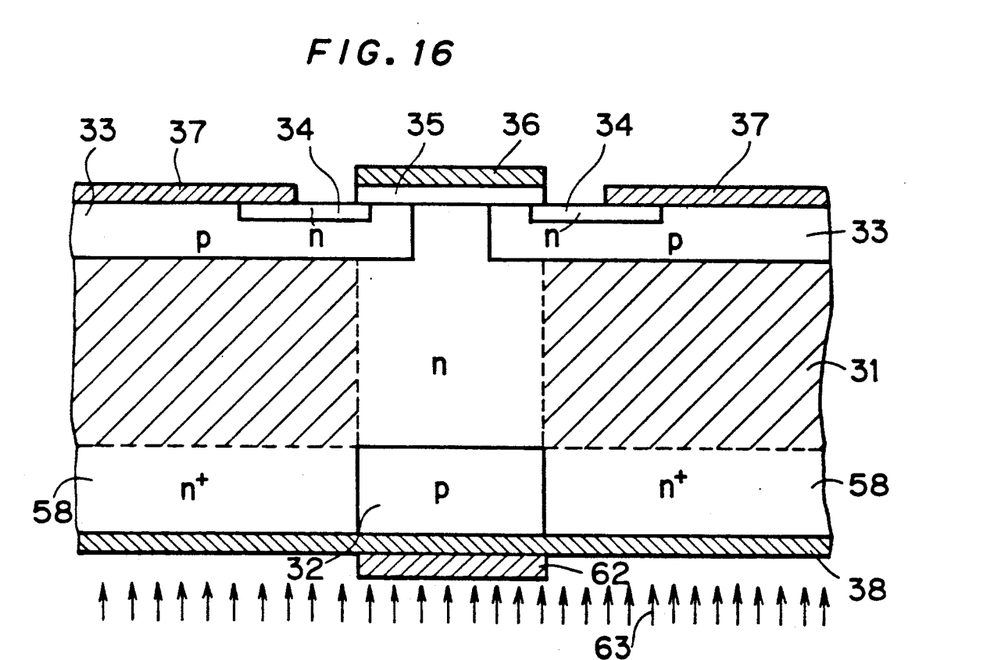
FIG. 16 is a sectional view showing a region for making a life time control with respect to the IGBT cell of FIG. 15.

In each embodiment mentioned above, a radiation such as an electron ray and so on may be irradiated into a section corresponding to the internal diode within the internal region of the semiconductor substrate 31 or a heavy metal such as platinum, gold and so on may be diffused into the same section in order to control a carrier life time of the internal diode, to thereby balance the characteristics of the internal diode with the characteristics of the IGBT cell. That is, first, for example, an IGBT device as shown in FIG. 15 is prepared. In the IGBT device, the width of the collector region 32 is virtually equal to that of the gate electrode 36, and the n+-type region 58 of the semiconductor substrate 31 is connected by ohmic contact with the collector electrode 38. Then, as shown in FIG. 16, a mask layer 62 of material such as lead and so on for preventing a radiation such as an electron ray and so on from permeating, is formed on an area except for an area corresponding to a parasitic diode within the surface of the collector electrode 38. Next, a radiation 63 such as an electron ray and so on is selectively irradiated into an internal region (shown by oblique lines in FIG. 16) of the semiconductor substrate 31 by utilizing the mask layer 62 as a mask in order to control a carrier life time of the parasitic diode. In order to control the carrier life time of the parasitic diode, a heavy metal such as a platinum, gold and so on may be diffused into the internal region of semiconductor substrate 33 shown by oblique lines in FIG. 16 in place of irradiating the radiation 63. In a case of diffusing the heavy metal, the heavy metal will be selectively diffused by utilizing an insulation film (not shown) such as an oxide film and so on as a mask before the emitter electrode 37 and the collector electrode 38 is formed.

Figure 17:
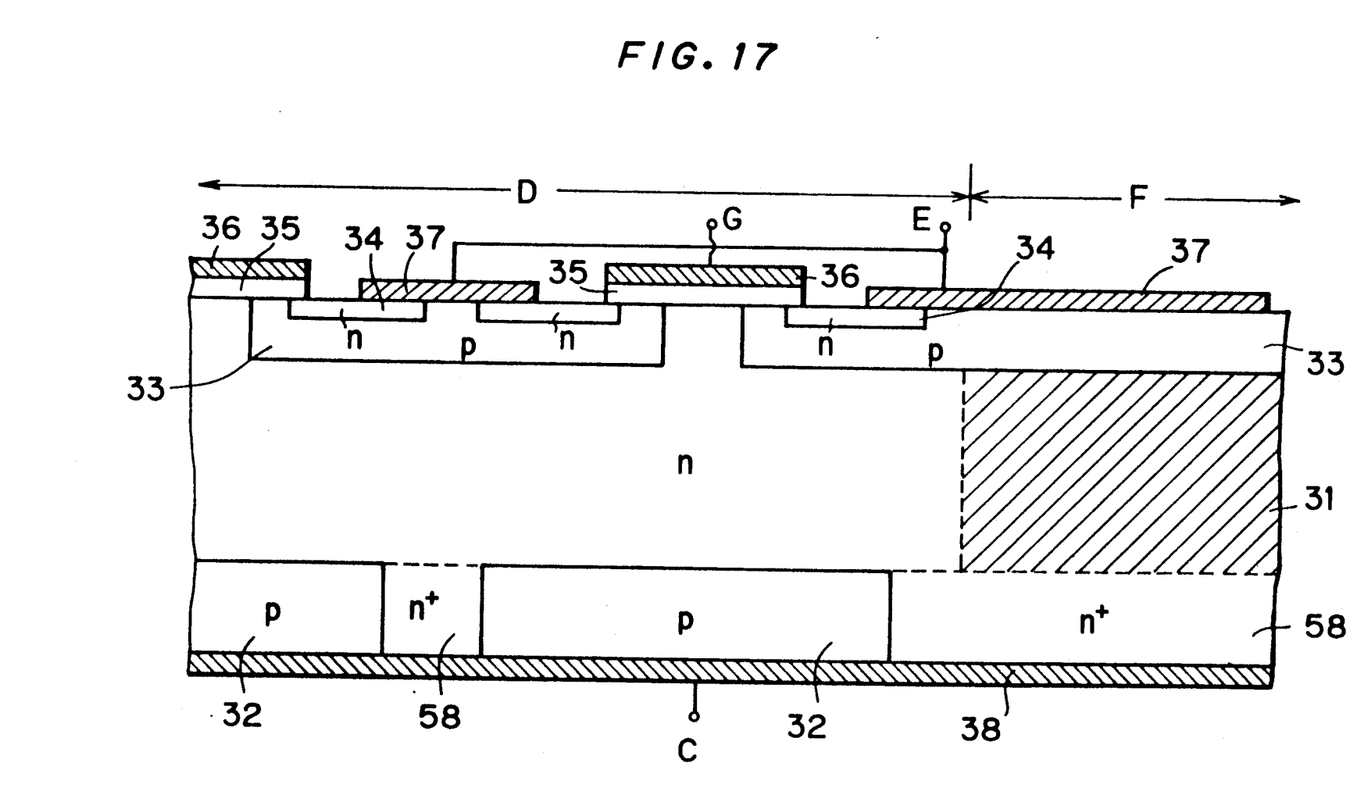
FIG. 17 is a sectional view showing a cell structure of an IGBT according to a fifth embodiment.

In each embodiment mentioned above, a fly-wheel diode may be provided in the semiconductor substrate 31. That is, for example, an IGBT part shown by a section D and a fly-wheel diode part shown by a section F may be formed in one chip as shown in FIG. 17. The IGBT part, for example, may be formed by the constructions of FIGS. 1, 11, 13 and 16, while the fly-wheel diode part may be formed by extending the base region 33, the n+-type region 58, the emitter electrode 37 and the collector electrode 38 to the section F. In that case, it is necessary to control a carrier life time of the fly-wheel diode part by irradiating a radiation or diffusing a heavy metal into the region (shown by oblique lines in FIG. 17) corresponding to the section F of the semiconductor substrate 31 in order to accelerate an working speed of the fly-wheel diode part.

In the above embodiments, it has been explained about the n-channel IGBT devices, but the present invention is also applicable to a p-channel IGBT device.

Figure 18:
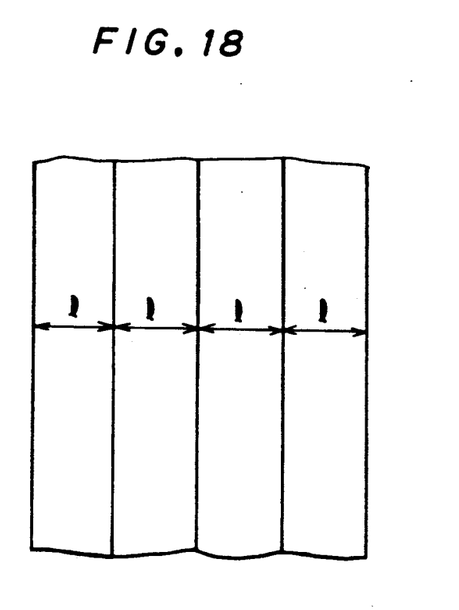
FIGS. 18 and 19 are plane views of an IGBT device for explaining a general strip cell structure respectively.

Generally, in an IGBT device, a stripe cell structure shown by a plane view of FIG. 58 is employed to prevent latch-up. It will be explained about that as follows while using the IGBT device having a sectional structure shown by FIG. 1. Referring to FIG. 1, a plurality of first unit cells are provided at the first major surface side, each first unit cell consisting of a part of collector electrode 38, one collector region 32 and one n+-type region 39 adjacent to the collector region 32, while a plurality of second unit cells are provided at the second major surface side, each second unit cell consisting of one gate electrode 36, one gate insulation film 35, one emitter region 34, one base region 33 and one emitter electrode 37. Both of the first and the second unit cells are formed into stripe structures having width of l, and are arranged in parallel respectively so that a longitudinal direction of each first unit cell becomes equal to that of each second unit cell.

Figure 19:
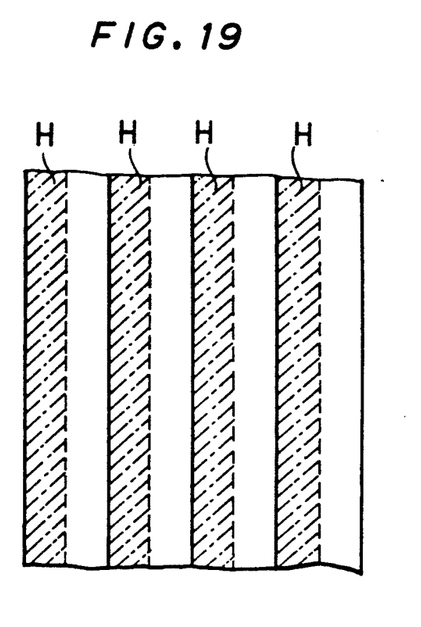

FIG. 19 is a plane view of the IGBT device observed from an emitter electrode side. In FIG. 19, region H designated by dashed lines shows a position corresponding to the n-type region 39 (see FIG. 1) of the first unit cell projected on the second unit cell. As mentioned above, a mask for forming the first unit cells is different from a mask for forming the second unit cells. Consequently, it is required to accurately align the mask for forming the first unit cells with the mask for forming the second unit cells in order to keep the predetermined positioning relation between the first unit cells and the second unit cells. However, since the width l of both unit cells is extremely small, for example less than several 10 μm, it is extremely difficult to accurately align the mask for forming the first unit cells with the mask for forming the second unit cells. As a result, the positioning relation between the first unit cells and the second unit cells is slightly varied in the cross direction of the unit cells to cause characteristics of IGBT to vary every product.

Figure 20:
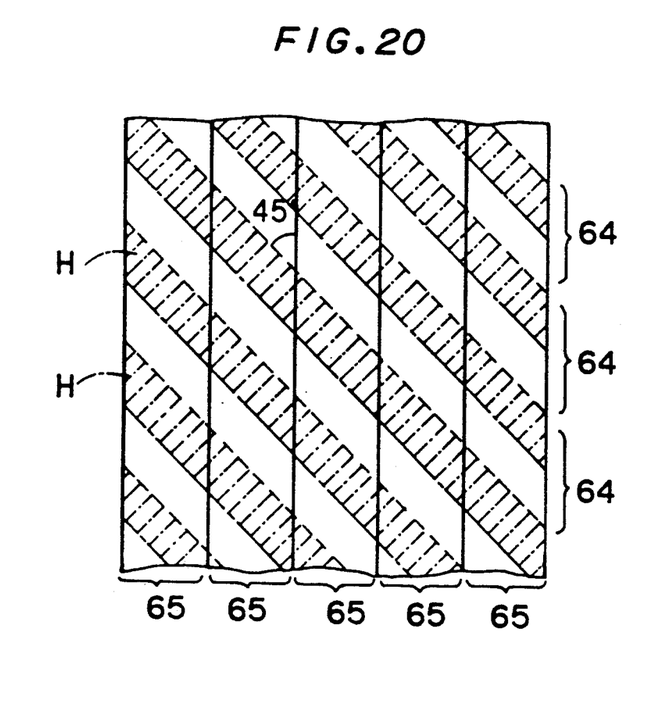
FIG. 20 is a plane view of an IGBT device for explaining a stripe cell structure of the embodiment.

To solve the above problem, such a stripe cell structure of an IGBT device as shown in FIG. 20 is employed. That is, the first unit cells 64 being provided at the first major surface side of the semiconductor substrate 31 are arranged in parallel with a stripe structure, while the second unit cells 65 being provided at the second major surface side of the semiconductor substrate 31 are arranged in parallel with a stripe structure, and the longitudinal directions of both unit cells 64 and 65 cross with each other with an angle of, for example, 45 degrees when the first unit cells is projected on the second unit cells. With employing the above construction, it is unnecessary to align both unit cells 64 and 65 with each other in the cross direction thereof, and it can cope with any fine width of unit cells 64 and 65 because measure of the longitudinal direction of the unit cells 64 and 65 is generally long, for example about 1 mm.

The stripe structure mentioned above is applicable to not only the IGBT device having the sectional structure as shown in FIG. 1 but also the other IGBT devices, for example, having the sectional structure as shown in FIGS. 11, 13 and 16.

Figure 21:
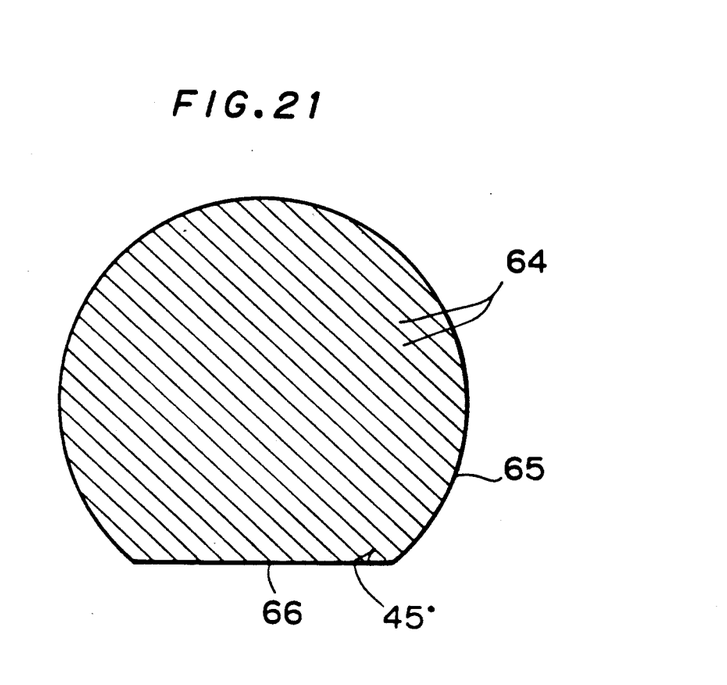
FIG. 21 is a view showing a pattern of first unit cells formed on a wafer.

As shown in FIG. 21, the longitudinal direction of the stripe structure of the first unit cell 64 may be crossed with 45 degrees with respect to an orientation flat 66 of a wafer 65, while the longitudinal direction of the stripe structure of the second unit cell (not shown) may be crossed with 90 or 180 degrees with respect to the orientation flat 66. In that case, it is unnecessary to align the mask for first unit cells with the mask for second unit cells.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An insulated gate bipolar transistor comprising:
a first conductivity type semiconductor substrate;
a first region of a second conductivity type partially formed on a first major surface of said semiconductor substrate;
a second region of the second conductivity type partially formed on a second major surface of said semiconductor substrate;
a third region of the first conductivity type partially formed on a surface of said second region;
an insulation film formed on the surface of said second region and extending between the surfaces of said semiconductor substrate and said third region, said insulation film virtually locationally corresponding to said first region;
a control electrode formed on said insulation film;
a first electrode formed on said second major surface extending over said third region and said second region;
a second electrode formed on said first major surface extending over said first region and a region adjacent to said first region of said semiconductor substrate; and
a barrier layer formed at a region except for said first region within said first major surface of said semiconductor substrate for restricting movement of a carrier which moves toward said second electrode from said semiconductor substrate.

2. An insulated gate bipolar transistor in accordance with claim 1, wherein
said barrier layer is a Schottky barrier layer.

3. An insulated gate bipolar transistor comprising:
a first conductivity type semiconductor substrate;
a first region of a second conductivity type partially formed on a first major surface of said semiconductor substrate;
a second region of the second conductivity type partially formed on a second major surface of said semiconductor substrate;
a third region of the first conductivity type partially formed on a surface of said second region;
an insulation film formed on the surface of said second region and extending between the surfaces of said semiconductor substrate and said third region, said insulation film virtually locationally corresponding to said first region;
a control electrode formed on said insulation film;
a first electrode formed on said second major surface extending over said third region and said second region; and
a second electrode formed on said first major surface extending over said first region and a region adjacent to said first region of said semiconductor substrate;
a region except for said first region within said first major surface of said semiconductor substrate being connected with said second electrode by ohmic contact, an area of a connecting part therebetween being smaller than that of a connecting part between said first region and said second electrode.

4. An insulated gate bipolar transistor comprising:
a first conductivity type semiconductor substrate;
a first region of a second conductivity type partially formed on a first major surface of said semiconductor substrate;
a second region of the second conductivity type partially formed on a second major surface of said semiconductor substrate;
a third region of the first conductivity type partially formed on a surface of said second region;
an insulation film formed on the surface of said second region and extending between the surfaces of said semiconductor substrate and said third region, said insulation film virtually locationally corresponding to said first region;
a control electrode formed on said insulation film;
a first electrode formed on said second major surface extending over said third region and said second region; and
a second electrode formed on said first major surface extending over said first region and a region adjacent to said first region of said semiconductor substrate;
a region except for said first region within said first major surface of said semiconductor substrate being sectioned into a first area and a second area, said first area being connected with said second electrode by ohmic contact while a barrier layer being formed at a connecting part between said second area and said second electrode.

5. An insulated gate bipolar transistor in accordance with claim 4, wherein
said barrier layer is a Schottky barrier layer.

6. An insulated gate bipolar transistor in accordance with any of claims 1 to 5,
said semiconductor device further comprising a diode which is electrically connected between said first electrode and said second electrode so as to be connected in parallel with a parasitic diode consisting of said second region and said semiconductor substrate, a rate of a current flowing in said diode being set to be larger than that of a current flowing in said parasitic diode, said diode being formed in a different chip from a chip in which said parasitic diode is formed.

7. An insulated gate bipolar transistor in accordance with any of claims 1 to 5,
said semiconductor device further comprising a diode which is electrically connected between said first electrode and said second electrode so as to be connected in parallel with a parasitic diode consisting of said second region and said semiconductor substrate, a rate of a current flowing in said diode being set to be larger than that of a current flowing in said parasitic diode, said diode being formed in a chip in which said parasitic diode is formed.

8. An insulated gate bipolar transistor in accordance with any of claims 1 to 5,
wherein a plurality of first unit cells are provided at the first major surface side with a stripe structure, each said first unit cell consisting of said first region, said region adjacent to said first region of said semiconductor substrate and a part of said second electrode, while a plurality of second unit cells are provided at the second major surface side with a stripe structure, each said second unit cell consisting of said control electrode, said insulation film, said first electrode, said second region, said third region and a part of semiconductor substrate, and wherein longitudinal directions of each said first unit cell and each said second unit cell cross with each other when each said second unit cell is projected on each said first unit cell.

9. An insulated gate bipolar transistor in accordance with claim 8,
wherein a cross angle between longitudinal directions of each said first unit cell and each said second unit cell is 45 degrees.

10. An insulated gate bipolar transistor in accordance with claim 9,
wherein said first unit cells and said second unit cells are provided on a wafer having an orientation flat, and wherein the longitudinal direction of each said first unit cell crosses with 45 degrees with respect to said orientation flat, while the longitudinal direction of each said second unit cell crosses with 90 or 180 degrees with respect to said orientation flat.

* * * * *